(12) United States Patent
Liao et al.

(10) Patent No.: US 6,765,349 B2
(45) Date of Patent: Jul. 20, 2004

(54) HIGH WORK FUNCTION METAL ALLOY CATHODE USED IN ORGANIC ELECTROLUMINESCENT DEVICES

(75) Inventors: Liang-Sheng Liao, Rochester, NY (US); Joseph K. Madathil, Rochester, NY (US); Pranab K. Raychaudhuri, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 12 days.

(21) Appl. No.: 10/260,666

(22) Filed: Sep. 30, 2002

(65) Prior Publication Data

US 2004/0061435 A1 Apr. 1, 2004

(51) Int. Cl.$^7$ .............................. H05B 33/02; H01J 1/02
(52) U.S. Cl. ....................................... 313/504; 313/503
(58) Field of Search ................................ 313/504, 505, 313/506, 507, 508, 509, 510, 511, 512; 428/690, 917; 257/40

(56) References Cited

U.S. PATENT DOCUMENTS

| | | | | |
|---|---|---|---|---|
| 3,180,730 A | * | 4/1965 | Klupfel et al. ............. 430/74 |
| 3,567,450 A | * | 3/1971 | Brantly et al. ............. 430/73 |
| 3,658,520 A | * | 4/1972 | Brantly et al. ............. 430/73 |
| 4,356,429 A | * | 10/1982 | Tang .......................... 313/503 |
| 4,539,507 A | * | 9/1985 | VanSlyke et al. ........... 313/504 |
| 4,720,432 A | * | 1/1988 | VanSlyke et al. ........... 428/457 |
| 4,768,292 A | * | 9/1988 | Manzei ........................ 34/70 |
| 4,769,292 A |   | 9/1988 | Tang et al. |
| 4,885,211 A |   | 12/1989 | Tang et al. |
| 5,059,862 A |   | 10/1991 | VanSlyke et al. |
| 5,121,029 A | * | 6/1992 | Hosokawa et al. ......... 313/504 |
| 5,141,671 A | * | 8/1992 | Bryan et al. ............. 252/301.16 |
| 5,150,006 A | * | 9/1992 | Van Slyke et al. ......... 313/504 |
| 5,151,629 A | * | 9/1992 | VanSlyke ................... 313/504 |
| 5,283,182 A | * | 2/1994 | Powell et al. ............. 435/106 |
| 5,294,870 A | * | 3/1994 | Tang et al. ................. 313/504 |
| 5,405,709 A | * | 4/1995 | Littman et al. ............. 428/690 |
| 5,484,922 A | * | 1/1996 | Moore et al. .................. 546/7 |
| 5,503,910 A | * | 4/1996 | Matsuura et al. ........... 428/212 |
| 5,593,788 A | * | 1/1997 | Shi et al. ................... 428/690 |
| 5,645,948 A | * | 7/1997 | Shi et al. ................... 428/690 |
| 5,683,823 A | * | 11/1997 | Shi et al. ................... 428/690 |
| 5,688,551 A | * | 11/1997 | Littman et al. .............. 427/64 |
| 5,703,436 A | * | 12/1997 | Forrest et al. ............. 313/506 |
| 5,755,999 A | * | 5/1998 | Shi et al. ............... 252/301.16 |
| 5,776,622 A |   | 7/1998 | Hung et al. |
| 5,851,709 A | * | 12/1998 | Grande et al. ................. 430/7 |
| 5,928,802 A | * | 7/1999 | Shi et al. ................... 428/690 |
| 5,935,720 A | * | 8/1999 | Chen et al. ................. 428/690 |
| 5,935,721 A | * | 8/1999 | Shi et al. ................... 428/690 |
| 6,020,078 A | * | 2/2000 | Chen et al. ................. 428/690 |
| 6,066,357 A | * | 5/2000 | Tang et al. .................. 427/66 |
| 6,140,763 A |   | 10/2000 | Hung et al. |
| 6,166,488 A | * | 12/2000 | Arai .......................... 313/504 |
| 6,172,458 B1 |   | 1/2001 | Nakaya et al. |
| 6,226,869 B1 | * | 5/2001 | Heintke et al. ............. 30/34.1 |
| 6,303,239 B1 | * | 10/2001 | Arai et al. .................. 428/690 |
| 6,337,492 B1 | * | 1/2002 | Jones et al. ................. 257/40 |
| 6,423,429 B2 | * | 7/2002 | Kido et al. ................. 428/690 |

OTHER PUBLICATIONS

"Organic Electroluminescent diodes", by C. W. Tang et al., Applied Physics Letter 51 (12), Sep. 21, 1987, pp. 913–915.
"Electroluminescence of doped organic thin films" by C. W. Tang et al., Journal Appied Physics 65 (9), May 1, 1989, pp. 3610–3616.

* cited by examiner

Primary Examiner—Nimeshkumar D. Patel
Assistant Examiner—Karabi Guharay
(74) Attorney, Agent, or Firm—Raymond L. Owens

(57) ABSTRACT

An organic electroluminescent device including an anode, an electroluminescent medium, and a metal alloy cathode comprising at least two metals, wherein all the metals of the alloy have their work function higher than 4.0 eV.

6 Claims, 3 Drawing Sheets

HIGH WORK FUNCTION METAL ALLOY CATHODE USED IN ORGANIC ELECTROLUMINESCENT DEVICES

FIELD OF THE INVENTION

The present invention relates to organic electroluminescent devices. More particularly, it relates to using new cathode materials.

BACKGROUND OF THE INVENTION

Organic electroluminescent (EL) devices or organic light-emitting diodes (OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface at the HTL. Tang et al. "Organic Electroluminescent Diodes", Applied Physics Letters, 51, 913 (1987), and commonly assigned U.S. Pat. No. 4,769,292 demonstrated highly efficient OLEDs using such a layer structure. Since then, numerous OLEDs with alternative layer structures have been disclosed. For example, there are three-layer OLEDs that contain an organic light-emitting layer (LEL) between the HTL and the ETL, such as that disclosed by Tang et al. "Electroluminescence of Doped Organic Thin Films", Journal Applied Physics, 65, 3610 (1989). The LEL commonly consists of a host material doped with a guest material, wherein the layer structures are denoted as HTL/LEL/ETL. Further, there are multilayer OLEDs that contain a hole-injecting layer (HIL), and/or an electron-injecting layer (EIL), and/or a hole-blocking layer, and/or an electron-blocking layer in the devices. These structures have further resulted in improved device performance.

Similar to the organic layer structures in the OLEDs, cathode also plays an important role in the overall performance of OLEDs. A cathode in the OLED is expected to have not only good electron-injecting ability, but also good corrosion resistance. As is known, the commonly used Mg:Ag cathode (Tang and VanSlyke, U.S. Pat. No. 4,885,211) and LiF/Al cathode (Hung and Tang, U.S. Pat. No. 5,776,622) have good electron-injecting ability, but they are subject to corrosion under ambient conditions. Moisture is detrimental to the cathode of OLEDs. Although encapsulation is applied to OLEDs for moisture prevention, it is difficult to fully get rid of moisture after encapsulation, and cathode corrosion at the edge and on the top of each light-emitting pixels still exists, which forms dark edge and dark spots to reduce effective emitting area. Especially for the OLEDs on flexible polymer substrate, moisture elimination is even more difficult to deal with. Therefore, cathode with better corrosion resistance is necessary for stability improvement of OLEDs.

Some metal alloys are used as cathode in OLEDs for the purpose of improving adhesion property or improving electron injection ability, such as the aforementioned Mg:Ag, Al:Mg (VanSlyke and Tang, U.S. Pat. No. 5,059,862), Al:Li (Hung, et al. U.S. Pat. No. 6,140,763), and Al:Li:Cu:Mg:Zr (Nakaya et al. U.S. Pat. No. 6,172,458). Those metal alloys contain at least one kind of low work function metal (by low means the value of work function is less than 4.0 eV) and are still subject to corrosion under ambient conditions.

SUMMARY OF THE INVENTION

It is an object of the present invention to provide an OLED with a high work function metal alloy cathode having enhanced corrosion resistance.

It is another object of the present invention to provide an OLED with low dark edge growth rate.

It is another object of the present invention to improve the operational stability of OLEDs.

These objects are achieved in an organic electroluminescent device comprising, in sequence:

a) an anode;

b) an electroluminescent medium; and c) a metal alloy cathode comprising at least two metals, wherein all the metals of the alloy have their work function higher than 4.0 eV.

ADVANTAGES

An advantage of the present invention is that a high work function metal alloy cathode can be made useful in OLEDs to enhance the corrosion resistance and to reduce the dark edge growth rate of the emitting area in the OLEDs.

Another advantage of the present invention is that the operational stability of the OLEDs can also be improved by using a high work function metal alloy cathode adjacent to an electron-injecting layer in the OLEDs.

Figure 1:
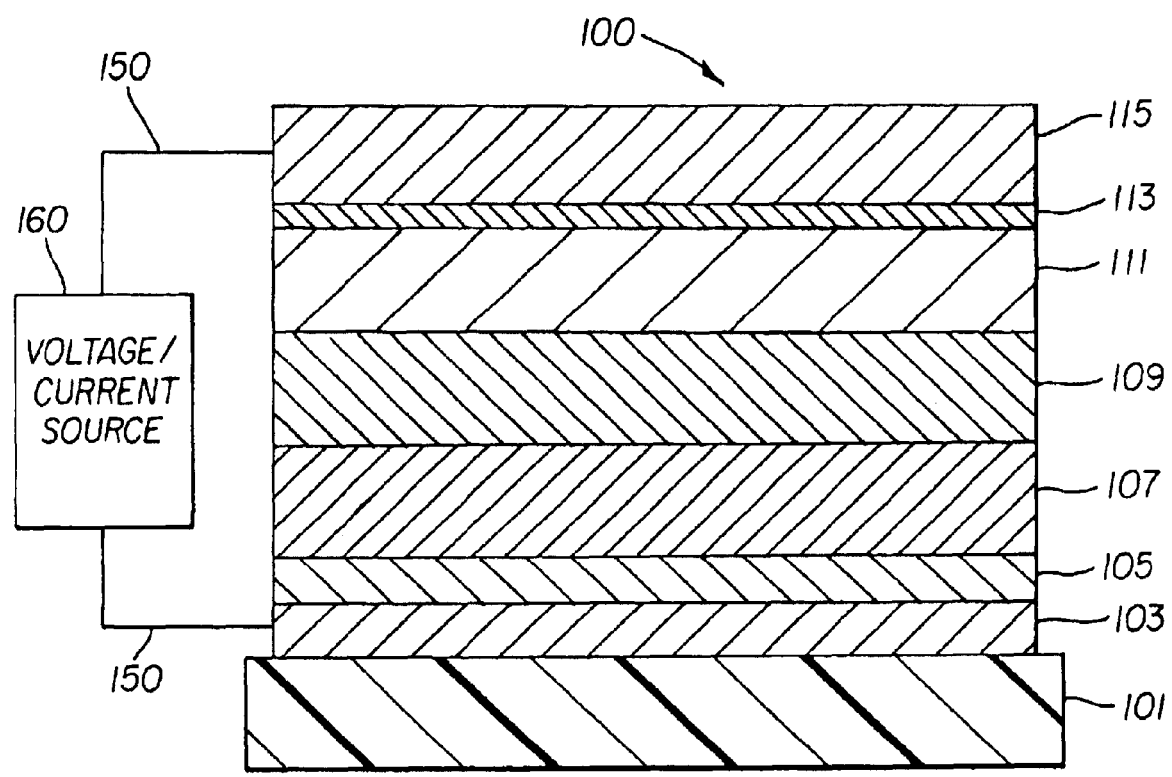
FIG. 1 is a schematic cross sectional view of an OLED in accordance with the present invention having a high work function metal alloy cathode adjacent to an EIL.

It will be understood that FIG. 1 is not to scale since the individual layers are too thin and the thickness differences of various elements are too great to permit depiction to scale.

DETAILED DESCRIPTION OF THE INVENTION

FIG. 1 shows an organic electroluminescent device (OLED) 100 in accordance with the present invention. OLED 100 comprises a substrate 101, an anode layer 103, an optional hole-injecting layer (HIL) 105, a hole-transporting layer (HTL) 107, a light-emitting layer (LEL) 109, an electron-transporting layer (ETL) 111, an electron-injecting layer (EIL) 113, and a high work function metal alloy cathode 115. While FIG. 1 serves as an example, there are numerous OLEDs known in the art with alternative layer structures. The present invention is applicable to any OLED containing an organic EL medium and a cathode.

OLED 100 is operated by applying an electric potential, generated by voltage/current source 160, between anode 103 and the cathode 115, such that anode 103 is at a more positive potential with respect to the cathode 115. Electrical conductors 150 connect anode 103 and cathode 115 to voltage/current source 160. By applying an electric potential, holes (positively charged carriers) are injected from anode 103 through HIL 105 into HTL 107. Simultaneously, electrons (negatively charged carriers) are injected from cathode 115 through EIL 113 into ETL 111. The holes and electrons recombine in LEL 109. This hole-electron recombination results in light emission from LEL 109.

As mentioned previously, much more attention has been paid to improve electron-injecting properties and adhesion properties between organic EL medium and the cathode. Generally, high work function (>4.0 eV) metal alloyed with some low work function metals such as alkali metals and/or alkaline earth metals can effectively improve electron-injecting properties. However, the corrosion resistance of a cathode would be reduced after alloying with low work function metals in the cathode. In fact, a cathode in the OLED is expected to have not only good electron-injecting ability but also good corrosion resistance.

The performance of OLEDs closely relates to the corrosion resistance of the cathode. If a cathode is corrosive when exposed to moisture or oxygen, the edge of the cathode and the pin-holes on the surface of cathode will be oxidized quickly, forming an insulating oxide layer and resulting in non-emissive strip at the edges (dark edges) and non-emitting spots on the surface (dark spots) during normal operation. Measuring and comparing the dark edge growth width is a convenient way to compare the corrosion resistance between two different cathodes. Suppose cathode A has a dark edge growth width as twice fast as that of cathode B at the same operational or storage condition, and suppose two sides (or 4 sides) of each pixels are exposed to moisture, the emitting area of the pixels with cathode A would have 2 times (or about 4 times) faster shrinkage than the emitting area of the pixels with cathode B in the OLEDs. Even if the initial luminance of the OLED with cathode A could be higher than that of the OLED with cathode B, light emission from the OLED with cathode A would be worse than that of the OLED with cathode B after a certain time of exposure to moisture or oxygen due to the faster shrinkage of emitting area. As is known, alloying two or more high work function metals can enhance the corrosion resistance of the alloy. Therefore, high work function metal alloy cathode could be useful for the improvement of long term performance of the OLEDs.

Inserting an EIL such as thin LiF layer, or alkali metal doped Alq layer, or alkali metal compound doped Alq layer in between ETL and cathode, can expand the choice of high work function metals as cathode, but not every kind of high work function metal or alloy with good corrosion resistance can be useful as a cathode in OLEDs. For example, Ag, Au, and Cu have high work function and good corrosion resistance as a cathode material in OLEDs, and they can have good electron-injecting properties if they are used with certain EIL. However, Ag, Au, and Cu are diffusive in OLED resulting in severe luminance quenching and shortening the lifetime if those metal are used as cathode. Similarly, if those diffusive metals are alloyed with other high work function metals to form high work function metal alloy cathode, the diffusion problem could still exist at a certain alloying concentration. Therefore, choosing high work function metal alloy useful in OLEDs is not obvious because other properties, such as diffusion induced luminance quenching, have to be considered.

The high work function metal alloy chosen for a cathode in the present invention can have the formula of A:E wherein A is chosen from Al, Zn, or Group 4 through Group 10, and E is chosen from Group 4 through Group 10 of the Periodic Table of the Elements. Preferably, A is chosen from Al and E is chosen from Group 4 through Group 10 of the Periodic Table of the Elements. More preferably, in the formula of A:E, A is Al and E is Ni to form Al:Ni alloy wherein the volume ratio of A:E is in the range from 10:0.5 to 10:10, preferably, in the range from 10:0.5 to 10:4.

The high work function metal alloy chosen for a cathode in the present invention can also have the formula of A:E:G wherein A is chosen from Al, Zn, or Group 4 through Group 10, and both E and G are chosen from Group 4 through Group 10 of the Periodic Table of the Elements. Preferably, A is chosen from Al and both E and G are chosen from Group 4 through Group 10 of the Periodic Table of the Elements wherein the volume ratio of A:E:G is in the range from 10:0.1:0.1 to 10:10:10, preferably, in the range from 10:0.5:0.1 to 10:5:1.

The high work function metal alloy chosen for a cathode in the present invention has a thickness greater than 50 nm. The cathode can be fabricated by thermal evaporation of two or more separated metal sources, or by electron beam evaporation of two or more separated metal sources, or by sputtering of a metal alloy target. Preferably, sputtering of a metal alloy target is used for the fabrication of the cathode. In order to enhance the corrosion resistance, cathode does not contain any metal with its work function being lower than 4.0 eV. Moreover, the cathode is used with and adjacent to an electron-injecting layer.

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through anode 103, the anode should be transparent or substantially transparent to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well known photolithographic processes. Optionally, anodes may be polished prior to application of other layers to reduce surface roughness so as to minimize shorts or enhance reflectivity.

While not always necessary, it is often useful to provide a HIL in contact to the anode 103. The HIL can serve to improve the film formation property of subsequent organic layers and to facilitate injection of holes into the HTL, reducing the driving voltage of the OLED. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl) phenylamino]triphenylamine). A p-type doped organic layer (with holes as majority carriers) is also useful for the HIL as described in U.S. Pat. No. 6,423,429 B2. Alternative hole-injecting materials reportedly useful in organic EL devices are described in EP 0 891 121 A1 and EP 1 029 909 A1.

The HTL in the OLED contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used, including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the LEL in organic EL units includes a luminescent or fluorescent material where electroluminescence is produced as a result of electron-hole pair recombination in this region. The LEL can be comprised of a single material, but more commonly consists of a host material doped with a guest compound or compounds where light emission comes primarily from the dopant and can be of any color. The host materials in the LEL can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes [e.g., poly(p-phenylenevinylene), PPV] can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-µ-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to, derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Preferred thin film-forming materials for use in forming the ETL in the organic EL units of the present invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

It is useful to provide an EIL in contact to the cathode 115. The EIL can serve to facilitate injection of electrons into the ETL and to increase the electrical conductivity resulting in a low driving voltage of the OLED. Suitable materials for use in the EIL are the aforementioned ETL with strong reducing agents as dopants or with low work function metals (<3.0 eV) as dopants to form an n-type doped organic layer (with electrons as majority carriers). Alternative inorganic electron-injecting materials can also be useful in the OLED, such as a 0.5~1 nm LiF layer as described in U.S. Pat. No. 5,677,572.

In some instances, LEL and ETL in the OLED can optionally be collapsed into a single layer that serves the function of supporting both light emission and electron transportation. It also known in the art that emitting dopants may be added to the HTL, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in U.S. Patent Publication 2002/0025419 A1; U.S. Pat. Nos. 5,683,823; 5,503,910; 5,405,709; 5,283,182; EP 1 187 235; and EP 1 182 244.

Additional layers such as electron or hole-blocking layers as taught in the art may be employed in devices of the present invention. Hole-blocking layers are commonly used to improve efficiency of phosphorescent emitter devices, for example, as in U.S. Patent Publication 2002/0015859 A1.

This invention may be used in so-called stacked device architecture, for example, as taught in U.S. Pat. Nos. 5,703,436 and 6,337,492.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats, or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various well known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

EXAMPLES

The following examples are presented for a further understanding of the present invention. For purposes of brevity, the materials and layers formed therefrom will be abbreviated as given below.

| | |
|---|---|
| ITO: | indium-tin-oxide; used in forming transparent anode on glass substrates |
| CFx: | polymerized fluorocarbon layer; used in forming HIL in electroluminescent medium |
| NPB: | 4,4'-bis(1-naphthyl-N-phenylamino)biphenyl; used in forming HTL in electroluminescent medium |
| Alq: | tris(8-hydroxyquinoline)aluminum(III); used in forming both LEL and ETL in electroluminescent medium |
| CuPc: | copper phthalocyanine; used in forming an EIL in electroluminescent medium |
| LiF: | lithium fluoride; used in forming EIL in electroluminescent medium |
| Al:Ni: | aluminum:nickel at a ratio from 10:1 to 10:4 by volume; used in forming cathode |

The EL characteristics of all the fabricated devices were evaluated using a constant current source and a photometer.

The luminance efficiency and the driving voltage were measured at a current density of 20 mA/cm$^2$. Dark edge width is measured and compared by taking electroluminescence images using a CCD camera before and after the devices were stored under ambient conditions for a certain time. Some devices were subjected to accelerated stability tests, operated under 20 mA/cm$^2$ at 70° C.

Example 1 (Comparative)

The preparation of a conventional OLED is as follows: A ~0.7 mm thick glass substrate coated with a patterned transparent ITO conductive layer was cleaned and dried using a commercial glass scrubber tool. The thickness of ITO is about 85 nm and the sheet resistance of the ITO is about 30 Ω/square. The ITO surface was subsequently treated with oxidative plasma to condition the surface as an anode. A layer of CFx, 1 nm thick, was deposited on the clean ITO surface as the HIL by decomposing CHF$_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately 10$^{-6}$ Torr:

(1) a HTL, 75 nm thick deposited with a rate of 0.4 nm/s, consisting of NPB;
(2) an ETL (also serving as the emissive layer), 60 nm thick deposited with a rate of 0.4 nm/s, consisting of Alq;
(3) an EIL, 0.5 nm thick deposited with a rate of 0.1 nm/s, consisting of LiF;
(4) a cathode, approximately 70 nm thick deposited with a rate of ~0.5 nm/s, consisting of thermally evaporated Al.

The device was completed without encapsulation and its structure is denoted as ITO/CFx/NPB(75)/Alq(60)/LiF(0.5)/Al(thermal).

Figure 2:
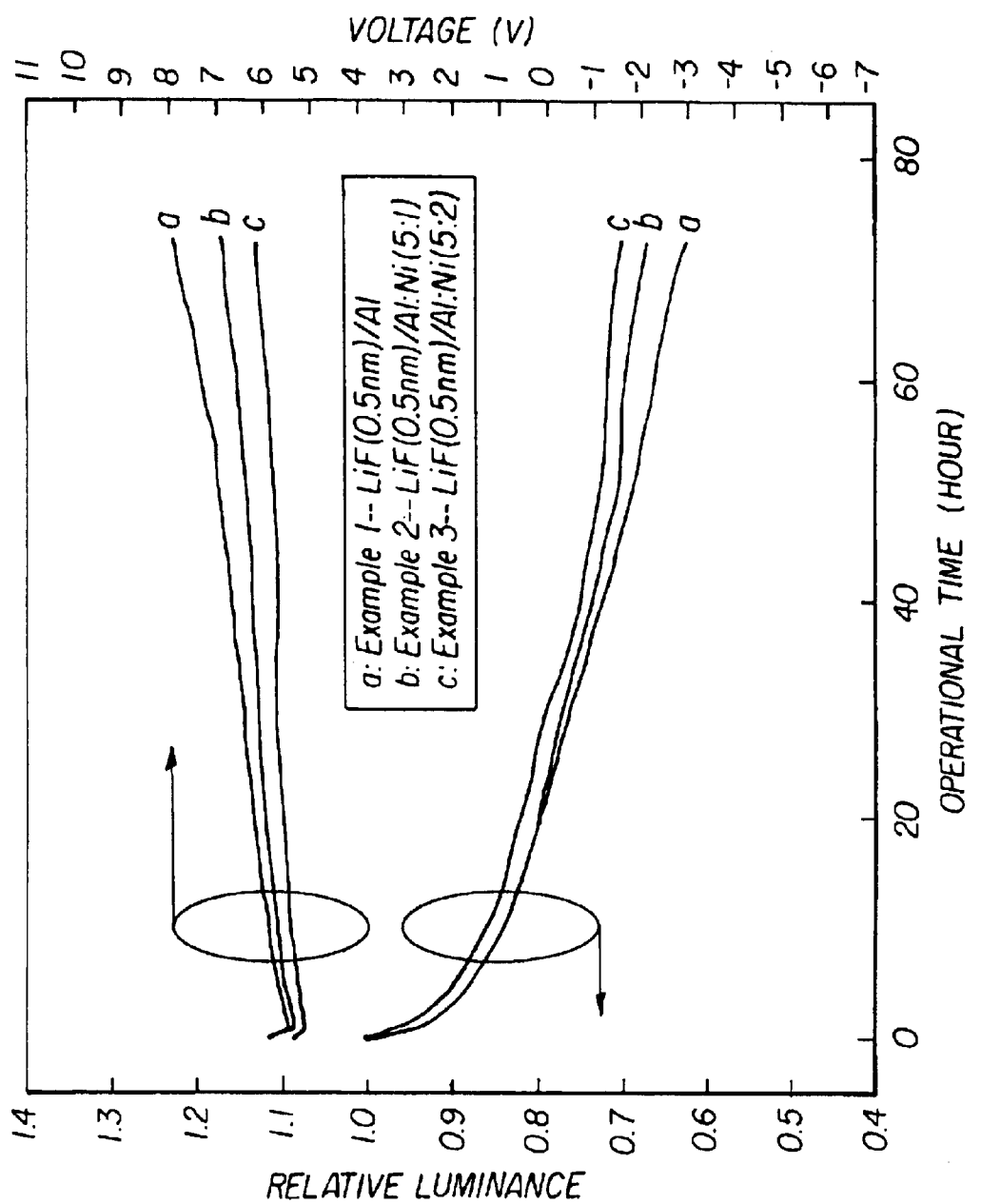
FIG. 2 compares the operational stability between an OLED with Al cathode and the OLEDs having thermally evaporated Al:Ni cathode.
Figure 3:
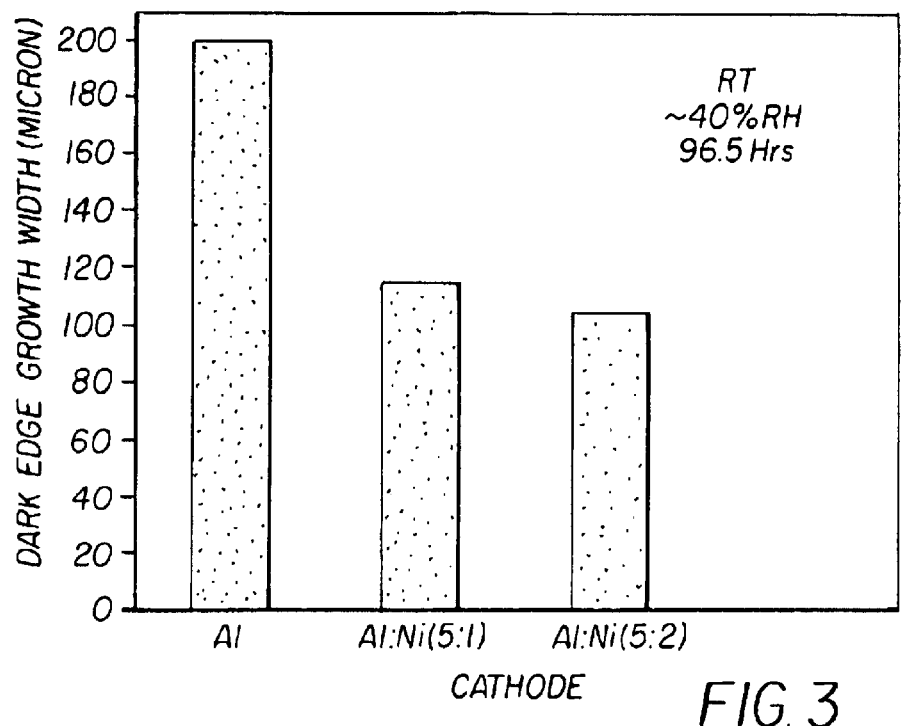
FIG. 3 compares the dark edge growth between an OLED with Al cathode and the OLEDs having thermally evaporated Al:Ni cathode.

This device requires a driving voltage of 5.9 V to pass 20 mA/cm$^2$. Its luminance is 688 cd/m$^2$ and its luminance efficiency is about 3.4 cd/A. The luminance decay vs. operational time and the voltage evolution vs. operational time at 70° C. are shown in FIG. 2. The dark edge width after about 100 hours' storage under ambient conditions is shown in FIG. 3.

Example 2 (Inventive)

OLEDs similar to that of Comparative Example 1 were prepared, except that the cathode was thermally co-evaporated Al:Ni with a ratio of 10:2 by volume. The device was completed without encapsulation and its structure is denoted as ITO/CFx/NPB(75)/Alq(60)/LiF(0.5)/Al:Ni (10:2, thermal).

This device requires a driving voltage of 5.8 V to pass 20 mA/cm$^2$. Its luminance is 578 cd/m$^2$ and its luminance efficiency is about 2.9 cd/A. The luminance decay vs. operational time and the voltage evolution vs. operational time at 70° C. are shown in FIG. 2. The dark edge width after about 100 hours' storage under ambient conditions is shown in FIG. 3.

Example 3 (Inventive)

OLEDs similar to that of Comparative Example 1 were prepared, except that the cathode was thermally co-evaporated Al:Ni with a ratio of 10:4 by volume. The device was completed without encapsulation and its structure is denoted as ITO/CFx/NPB(75)/Alq(60)/LiF(0.5)/Al:Ni (10:4, thermal).

This device requires a driving voltage of 5.4 V to pass 20 mA/cm$^2$. Its luminance is 571 cd/m$^2$ and its luminance efficiency is about 2.9 cd/A. The luminance decay vs. operational time and the voltage evolution vs. operational time at 70° C. are shown in FIG. 2. The dark edge width after about 100 hours' storage under ambient conditions is shown in FIG. 3.

The advantage of the Al:Ni cathode can be appreciated by comparing the operational stability between Examples 1, 2, and 3 in FIG. 2. With the increase of Ni content in Al cathode, the increasing rate of driving voltage vs. operational time is decreased, and the luminance decay vs. operational time is also decreased. It indicates that the overall operational stability of OLED can have obvious improvement by using Al:Ni cathode. Moreover, as indicated in FIG. 3, the device with Al cathode has a dark edge width of 0.2 mm, which is nearly as twice wide as that of the device with Al:Ni cathode after about 100 hours' storage under ambient conditions. Assuming each emitting pixels in a display has a size of 0.5 mm×0.5 mm and the display is stored under ambient conditions without encapsulation for about 100 hours, there will be dark edge growth. The pixels can only have a 0.1 mm strip left to emit light if an aluminum cathode is used, and will have a 0.3 mm strip left to emit light if an Al:Ni cathode is used. Although the initial luminance of the device with Al cathode is about 20% higher than that of the devices with Al:Ni cathode, the real luminance reduction of the device with Al cathode could be 2 to 4 times faster than the device with Al:Ni cathode. This is due to the faster shrinkage of the emitting area. Therefore, dark edge growth is a parameter which is detrimental to the performance of OLEDs.

Example 4 (Comparative)

The preparation of another conventional OLED is as follows:

A ~1.1 mm thick glass substrate coated with a patterned transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing CHF$_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately 10$^{-6}$ Torr:

(1) a HTL, 75 nm thick deposited with a rate of 0.4 nm/s, consisting of NPB;
(2) an ETL (also serving as the emissive layer), 60 nm thick deposited with a rate of 0.4 nm/s, consisting of Alq;
(3) an organic EIL, 20 nm thick deposited with a rate of 0.4 nm/s, consisting of CuPc;
(4) another EIL, 0.5 nm thick deposited with a rate of 0.1 nm/s, consisting of LiF.

After the deposition of the aforementioned layers, an Al cathode, approximately 60 nm thick, was deposited with a rate of ~0.7 nm/s by sputtering a Al target using an ion sputter gun in the same deposition chamber. The sputter power is 100 W with an Ar gas pressure of 30 Torr.

The device was completed without encapsulation and its structure is denoted as ITO/CFx/NPB(75)/Alq(60)/CuPc(20)/LiF(0.5)/Al(sputter).

Figure 4:
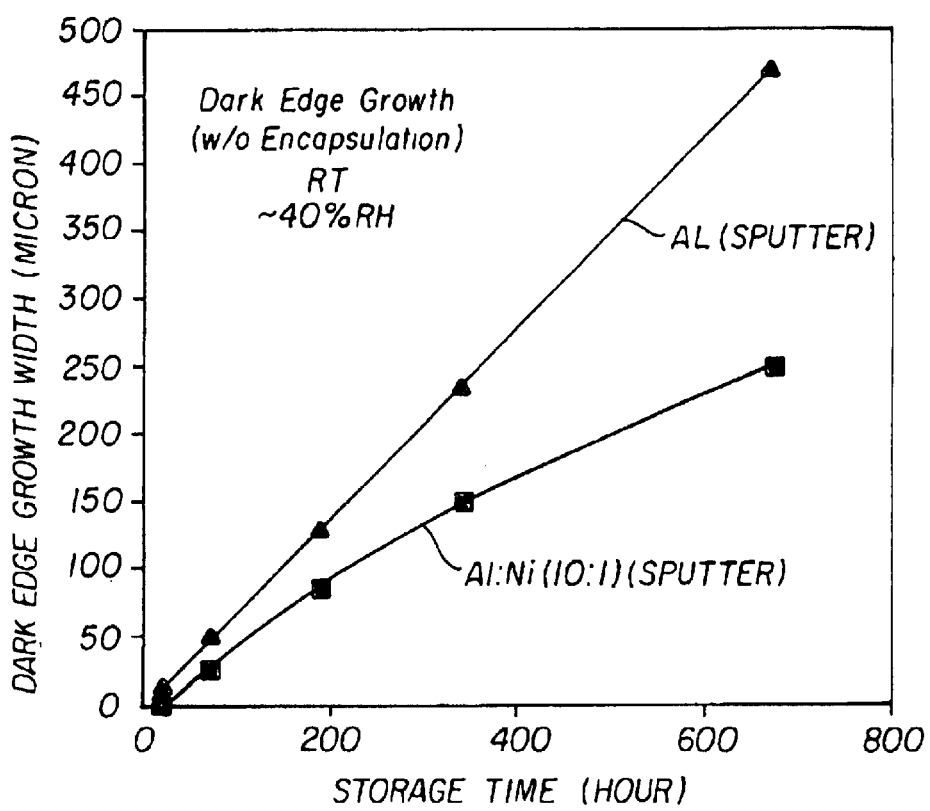
FIG. 4 compares the dark edge growth between an OLED with Al cathode and the OLEDs having sputter deposited Al:Ni cathode.

This device requires a driving voltage of 6.7 V to pass 20 mA/cm$^2$. Its luminance is 562 cd/m$^2$ and its luminance efficiency is about 2.8 cd/A. The dark edge growth vs. storage time under ambient conditions is shown in FIG. 4.

Example 5 (Inventive)

OLEDs similar to that of Example 4 were prepared, except that the Al target was replaced by an Al:Ni target with a ratio of about 10:1 by volume. The device was completed without encapsulation and its structure is denoted as ITO/CFx/NPB(75)/Alq(60)/CuPc(20)/LiF(0.5)/Al:Ni (10:1, sputter).

This device requires a driving voltage of 6.2 V to pass 20 mA/cm$^2$. Its luminance is 497 cd/m$^2$ and its luminance efficiency is about 2.5 cd/A. The dark edge growth vs. storage time under ambient conditions is shown in FIG. 4.

Similar to thermally evaporated Al:Ni cathode in Examples 2 and 3, the sputter deposited Al:Ni cathode for use in the OLEDs also exhibits superior corrosion resistance than Al cathode. By encapsulating the device, the Al:Ni cathode will have much less influence from residual moisture in the encapsulated devices.

The invention has been described in detail with particular reference to certain preferred embodiments thereof, but it will be understood that variations and modifications can be effected within the spirit and scope of the invention.

PARTS LIST

| | |
|---|---|
| 100 | organic electroluminescent device |
| 101 | substrate |
| 103 | anode |
| 105 | hole-injecting layer (HIL) |
| 107 | hole-transporting layer (HTL) |
| 109 | light-emitting layer (LEL) |
| 111 | electron-transporting layer (ETL) |
| 113 | electron-injecting layer (EIL) |
| 115 | high work function metal alloy cathode |
| 150 | electrical conductors |
| 160 | voltage/current source |

What is claimed is:

1. An organic electroluminescent device comprising:
   a) an anode;
   b) an electroluminescent medium; and
   c) a metal alloy cathode comprising at least two metals, wherein all the metals of the alloy have their work function higher than 4.0 eV, and wherein the cathode comprises a metal alloy of A:E, wherein A is chosen from Al, Zn, or Group 4 through Group 10, and E is chosen from Group 4 through Group 10 of the Periodic Table of the Elements, and wherein the volume ratio of A:E is in the range from 10:0.5 to 10:10.

2. The organic electroluminescent device of claim 1 wherein the cathode has a thickness greater than 50 nm.

3. An organic electroluminescent device comprising:
   a) an anode;
   b) an electroluminescent medium; and
   c) a metal alloy cathode comprising at least two metals, wherein all the metals of the alloy have their work function higher than 4.0 eV, and wherein the cathode comprises a metal alloy of Al:E, wherein E is chosen from Group 4 through Group 10 of the Periodic Table of the Elements, and wherein the volume ratio of Al:E is in the range from 10:0.5 to 10:10.

4. An organic electroluminescent device comprising:
   a) an anode;
   b) an electroluminescent medium; and
   c) a metal alloy cathode comprising at least two metals, wherein all the metals of the alloy have their work function higher than 4.0 eV, and wherein the cathode comprises a metal alloy of Al:Ni, and wherein the volume ratio of Al:Ni is in the range from 10:0.5 to 10:10.

5. An organic electroluminescent device comprising:
   a) an anode;
   b) an electroluminescent medium; and
   c) a metal alloy cathode comprising at least two metals, wherein all the metals of the alloy have their work function higher than 4.0 eV, and wherein the cathode comprises a metal alloy of Al:Ni, and wherein the volume ratio of Al:Ni is in the range from 10:0.5 to 10:4.

6. An organic electroluminescent device comprising:
   a) an anode;
   b) an electroluminescent medium; and
   c) a metal alloy cathode comprising at least two metals, wherein all the metals of the alloy have their work function higher than 4.0 eV, and wherein the cathode comprises a metal alloy of A:E:G, wherein A is chosen from Al, Zn, or Group 4 through Group 10, and both E and G are chosen from Group 4 through Group 10 in the Periodic Table of the Elements, and wherein the volume ratio of A:E:G can have a range from 10:0.1:0.1 to 10:10:10.

* * * * *